United States Patent
Ishida (10) Patent No.: US 10,263,440 B2
(45) Date of Patent: Apr. 16, 2019

(54) SHORT-CIRCUIT DETERMINATION METHOD AND ELECTRONIC DEVICE

(71) Applicant: FUJITSU LIMITED, Kawasaki-shi, Kanagawa (JP)

(72) Inventor: Manabu Ishida, Kawasaki (JP)

(73) Assignee: FUJITSU CONNECTED TECHNOLOGIES LIMITED, Kawasaki (JP)

(*) Notice: Subject to any disclaimer, the term of this patent is extended or adjusted under 35 U.S.C. 154(b) by 0 days.

(21) Appl. No.: 15/636,158

(22) Filed: Jun. 28, 2017

(65) Prior Publication Data

US 2018/0054072 A1   Feb. 22, 2018

(30) Foreign Application Priority Data

Aug. 18, 2016 (JP) .................. 2016-160871

(51) Int. Cl.
  *H02J 7/00* (2006.01)
  *G01R 31/02* (2006.01)
  *H02H 1/00* (2006.01)
  *H02H 3/16* (2006.01)

(52) U.S. Cl.
  CPC .......... *H02J 7/0031* (2013.01); *G01R 31/025* (2013.01); *H02H 1/0007* (2013.01); *H02H 3/16* (2013.01); *H02J 7/0052* (2013.01)

(58) Field of Classification Search
  CPC .............................. H02J 7/0031; H02J 7/0052

USPC ......................................................... 320/162
See application file for complete search history.

(56) References Cited

U.S. PATENT DOCUMENTS

| | | | | |
|---|---|---|---|---|
| 6,710,992 B2* | 3/2004 | Pannwitz | .............. | H02J 7/0031 361/90 |
| 2002/0097543 A1* | 7/2002 | Pannwitz | .............. | H02J 7/0031 361/90 |
| 2015/0372601 A1* | 12/2015 | Shiu | ........................ | H02M 1/32 363/21.12 |
| 2016/0149417 A1* | 5/2016 | Davis | .................... | H02J 7/0021 320/162 |
| 2017/0264204 A1* | 9/2017 | Motoki | ................... | H02M 1/08 |
| 2018/0026471 A1* | 1/2018 | Lu | ............................ | H02J 7/04 320/134 |

FOREIGN PATENT DOCUMENTS

| | | |
|---|---|---|
| JP | 2006-244788 | 9/2006 |
| JP | 2007-220574 | 8/2007 |

* cited by examiner

*Primary Examiner* — Suchin Parihar
(74) *Attorney, Agent, or Firm* — Westerman, Hattori, Daniels & Adrian, LLP (57) ABSTRACT

In an electronic device, a monitoring circuit monitors a voltage change with regard to each of an RX2+ terminal and an RX2− terminal in a state where a charging device is connected to a Type-C connector. A determining circuit determines whether a short-circuit between a VBUS terminal and the RX2+ and RX2− terminals has occurred using the voltage change at each of the RX2+ terminal and the RX2− terminal.

5 Claims, 5 Drawing Sheets

| GND | TX1+ | TX1- | VBUS | CC1 | D+ | D- | SBU1 | VBUS | RX2- | RX2+ | GND |
|---|---|---|---|---|---|---|---|---|---|---|---|
| GND | RX1+ | RX1- | VBUS | SBU2 | D- | D+ | CC2 | VBUS | TX2- | TX2+ | GND |

SHORT-CIRCUIT DETERMINATION METHOD AND ELECTRONIC DEVICE

CROSS-REFERENCE TO RELATED APPLICATION

This application is based upon and claims the benefit of priority of the prior Japanese Patent Application No. 2016-160871, filed on Aug. 18, 2016, the entire contents of which are incorporated herein by reference.

FIELD

Embodiments discussed herein are related to a short-circuit determination method and an electronic device.

BACKGROUND

In an electronic device including a connector for connection to an external device, when a charging device is connected to the connector while a foreign object is in the connector, power supplied from the charging device flows into the foreign object to cause heat generation in the foreign object, which may result in a malfunction of the electronic device. As a conventional technique related to a charging device, a technique is known which detects a state of communication with an electronic device to detect entrance of a foreign object.

In recent years, an electronic device including a connector (hereinafter, "Type-C connector") of a Type-C standard that is one of USB (Universal Serial Bus) standards as a connector for connection to an external device has been developed. Examples of terminals included in the Type-C connector are "VBUS terminal", "GND terminal", "RX1+ terminal", "RX1− terminal", "RX2+ terminal", and "RX2− terminal". The VBUS terminal is a charging terminal that receives charging power supplied from a charging device to an electronic device. The GND terminal is a ground terminal set at a ground potential. The RX1+ terminal and the RX1− terminal are a pair of signal terminals for receiving a differential signal. The RX2+ terminal and the RX2− terminal are a pair of signal terminals for receiving a differential signal. In the following description, when the RX1+ terminal and the RX1− terminal, and the RX2+ terminal and the RX2− terminal are not distinguished from each other, those are collectively referred to as "RXn+ terminal" and "RXn− terminal".

In the Type-C connector, the RXn terminal and the RXn− terminal are arranged between the VBUS terminal and the GND terminal. Therefore, when a foreign object enters into the Type-C connector, a short-circuit between the VBUS terminal and the RXn+ terminal or the RXn− terminal can easily occur. That is, when a foreign object bridging the VBUS terminal and the GND terminal enters into the Type-C connector, the VBUS terminal is brought conduction to the RXn+ terminal and the RXn− terminal by the foreign object, so that a short-circuit between the VBUS terminal and the RXn+ and RXn− terminals occurs. When a charging device is connected to the Type-C connector in a state where the VBUS terminal and the RXn+ terminal or the RXn− terminal are short-circuited, the foreign object generates heat due to a flow of power supplied from the charging device into the foreign object, so that the electronic device may be damaged. A connector for connection to an external device, other than the Type-C connector, also has the same problem as that of the Type-C connector, in a case where a pair of signal terminals for receiving a differential signal is arranged between the VBUS terminal and the GND terminal.

Therefore, it is expected in an electronic device including a connector for connection to an external device that a short-circuit between terminals caused by entrance of a foreign object into the connector is determined with high accuracy.

SUMMARY

According to an aspect of an embodiment, a short-circuit determination method in an electronic device including a connector for connection to an external device includes, in a state where a charging device is connected to the connector, monitoring a voltage change with regard to each of a pair of signal terminals that receives a differential signal among a plurality of terminals included in the connector, the pair of signal terminals being arranged between a charging terminal that receives power supplied from the charging device and a ground terminal; and determining whether a short-circuit between the charging terminal and the pair of signal terminals has occurred using a voltage change at each of the pair of signal terminals.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The disclosed technique is not limited to the embodiments.

[a] First Embodiment

Charging Mode of Electronic Device

Figure 1:
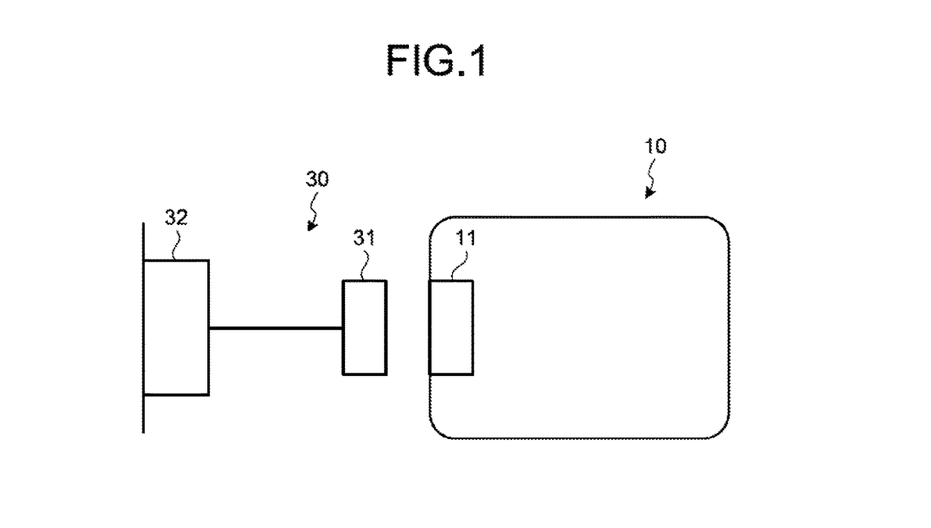
FIG. 1 is a diagram illustrating an example of a charging mode of an electronic device according to a first embodiment.

FIG. 1 is a diagram illustrating an example of a charging mode of an electronic device 10 according to a first embodiment. FIG. 1 illustrates a case where charging is performed using a charging device 30 including a Type-C connector 31. As illustrated in FIG. 1, the charging device 30 includes the Type-C connector 31 and an AC adapter 32. The Type-C connector 31 is connected to a commercial power supply that is an external power supply via the AC adapter 32. The AC adapter 32 steps down power of the commercial power supply, which is 100V AC power, for example, to convert the power to 5V DC power.

The electronic device 10 includes a Type-C connector 11. The Type-C connector 11 is a connector for connection to an external device. The Type-C connector 31 connected to the commercial power supply that is the external power supply via the AC adapter 32, and the Type-C connector 11 are connected to each other, so that the charging device 30 is connected to the Type-C connector 11 as the external device and the electronic device 10 is charged.

Mode of Arrangement of Terminals in Type-c Connector

Figure 2:
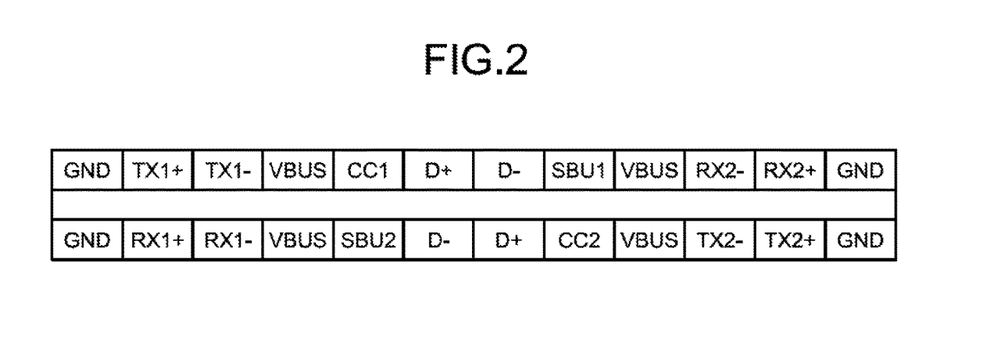
FIG. 2 is a diagram illustrating an example of a mode of arrangement of a plurality of terminals in a Type-C connector according to the first embodiment.

FIG. 2 is a diagram illustrating an example of a mode of arrangement of a plurality of terminals in the Type-C connector 11 according to the first embodiment. The Type-C connector 11 includes 12 terminals on an upper surface (hereinafter, "A-surface") in FIG. 2 and includes 12 terminals on a lower surface (hereinafter, "B-surface") in FIG. 2. The terminals on the A-surface are "GND terminal", "TX1+ terminal", "TX1− terminal", "VBUS terminal", "CC1 terminal", "D+ terminal", "D− terminal", "SBU1 terminal", "VBUS terminal", "RX2− terminal", "RX2+ terminal", and "GND terminal" in this order from left. The terminals on the B-surface are "GND terminal", "TX2+ terminal", "TX2− terminal", "VBUS terminal", "CC2 terminal", "D+ terminal", "D− terminal", "SBU2 terminal", "VBUS terminal", "RX1− terminal", "RX1+ terminal", and "GND terminal" in this order from right.

Among these terminals, the VBUS terminals are charging terminals that receive charging power supplied from the charging device 30 to the electronic device 10. The GND terminals are ground terminals set at a ground potential. The RX1+ terminal and the RX1− terminal are a pair of signal terminals for receiving a differential signal and support a USB 3.1 standard that is one of USB standards. The RX2+ terminal and the RX2− terminal are a pair of signal terminals for receiving a differential signal and support the USB 3.1 standard that is one of USB standards. In the following description, when the RX1+ terminal and the RX1− terminal, and the RX2+ terminal and the RX2− terminal are not distinguished from each other, those are collectively referred to as "RXn+ terminal" and "RXn− terminal".

In the Type-C connector 11, the RXn+ terminal and the RXn− terminal are arranged between the VBUS terminal and the GND terminal.

Configuration Example of Electronic Device and Charging Device

Figure 3:
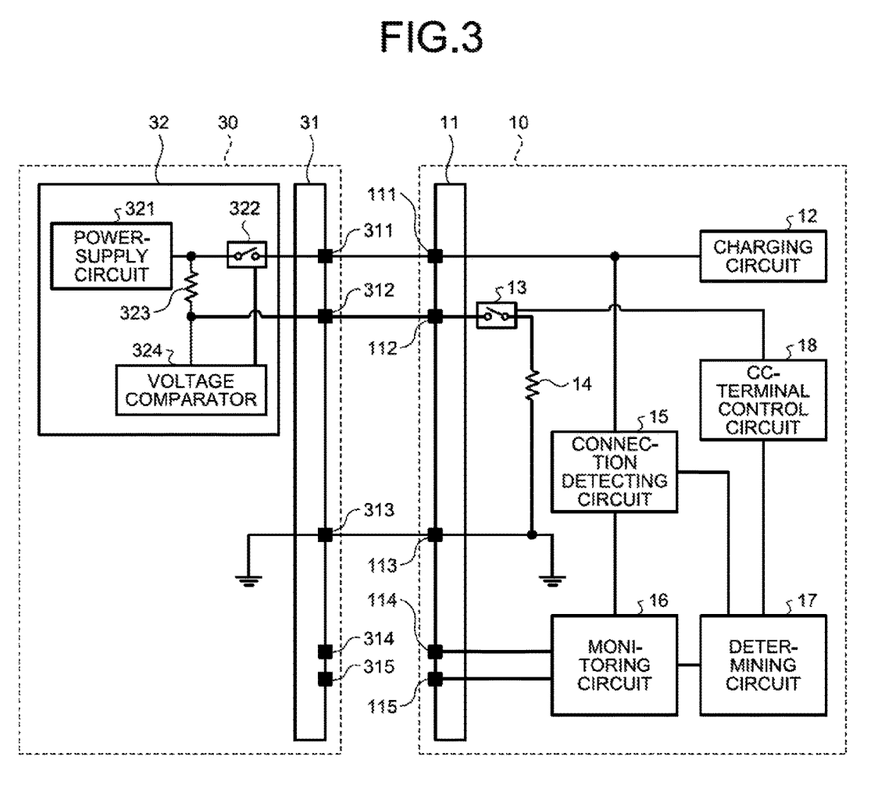
FIG. 3 is a diagram illustrating a configuration example of the electronic device and a charging device according to the first embodiment.

FIG. 3 is a diagram illustrating a configuration example of the electronic device 10 and the charging device 30 according to the first embodiment. In FIG. 3, the electronic device 10 includes the Type-C connector 11, a charging circuit 12, a switch 13, a resistor 14, a connection detecting circuit 15, a monitoring circuit 16, a determining circuit 17, and a CC-terminal control circuit 18. The Type-C connector 11 includes a VBUS terminal 111, a CC1 terminal 112, a GND terminal 113, an RX2+ terminal 114, and an RX2− terminal 115. The Type-C connector 11 is a connector for connection to an external device. The example of FIG. 3 illustrates a state where the charging device 30 is connected to the Type-C connector 11.

The VBUS terminal 111 is a charging terminal that receives charging power supplied from the charging device 30 to the electronic device 10, and corresponds to the fourth terminal from right on the A-surface in FIG. 2. The CC1 terminal 112 is a terminal that provides the charging device 30 with a resistance value of the resistor 14 for causing the charging device 30 to perform supply of power, and corresponds to the eighth terminal from the right on the A-surface in FIG. 2. The GND terminal 113 is a ground terminal set at a ground potential and corresponds to the first terminal from the right on the A-surface in FIG. 2. The RX2+ terminal 114 and the RX2− terminal 115 are a pair of signal terminals for receiving a differential signal and correspond to the second and third terminals from the right on the A-surface in FIG. 2, respectively. The RX2+ terminal 114 and the RX2− terminal 115 are not used in the state where the charging device 30 is connected to the Type-C connector 11, as illustrated in FIG. 3. In FIG. 3, terminals other than the VBUS terminal 111, the CC1 terminal 112, the GND terminal 113, the RX2+ terminal 114, and the RX2− terminal 115 are omitted for convenience of description. Further, in FIG. 3, a mode of arrangement of the VBUS terminal 111, the CC1 terminal 112, the GND terminal 113, the RX2+ terminal 114, and the RX2− terminal 115 is not consistent with that illustrated in FIG. 2 for convenience of description.

The charging circuit 12 charges a battery (not illustrated) with the power supplied from the charging device 30 via the VBUS terminal 111.

The resistor 14 is connected to the CC1 terminal 112 via the switch 13. The resistance value of the resistor 14 is provided to the charging device 30 via the switch 13 and the CC1 terminal 112, so that supply of the power in the charging device 30 is performed. In other words, the CC1 terminal 112 provides the charging device 30 with the resistance value of the resistor 14 for causing device 30 to perform supply of the power.

The connection detecting circuit 15 monitors a voltage (hereinafter, "VBUS voltage $V_1$" as appropriate) of the VBUS terminal 111, and detects whether the charging device 30 is connected to the Type-C connector 11 using the VBUS voltage $V_1$. That is, the connection detecting circuit 15 detects a state where the charging device 30 is not connected to the Type-C connector 11 when the VBUS voltage $V_1$ is 0 V, and detects a state where the charging device 30 is connected to the Type-C connector 11 when the VBUS voltage $V_1$ is larger than 0 V. When detecting a state where the charging device 30 is connected to the Type-C connector 11, the connection detecting circuit 15 outputs a notification indicating that detection (hereinafter, "charging-device connection detecting notification" as appropriate) together with the VBUS voltage $V_1$ to the monitoring circuit 16 and the determining circuit 17.

The monitoring circuit 16 uses the connection of the charging device 30 to the Type-C connector 11 as a trigger, and monitors a voltage change with regard to each of the RX2+ terminal 114 and the RX2− terminal 115. That is, the monitoring circuit 16 starts monitoring of a voltage change with regard to each of the RX2+ terminal 114 and the RX2− terminal 115 when a charging-device connection detecting notification is input from the connection detecting circuit 15. In the following description, a voltage at the RX2+ terminal 114 and a voltage at the RX2− terminal 115 are referred to as "RX2+ voltage $V_2$" and "RX2-voltage $V_3$", respectively.

The determining circuit 17 determines whether a short-circuit between the VBUS terminal 111 and the RX2+ and RX2− terminals 114 and 115 has occurred using the voltage change monitored by the monitoring circuit 16.

Figure 4:
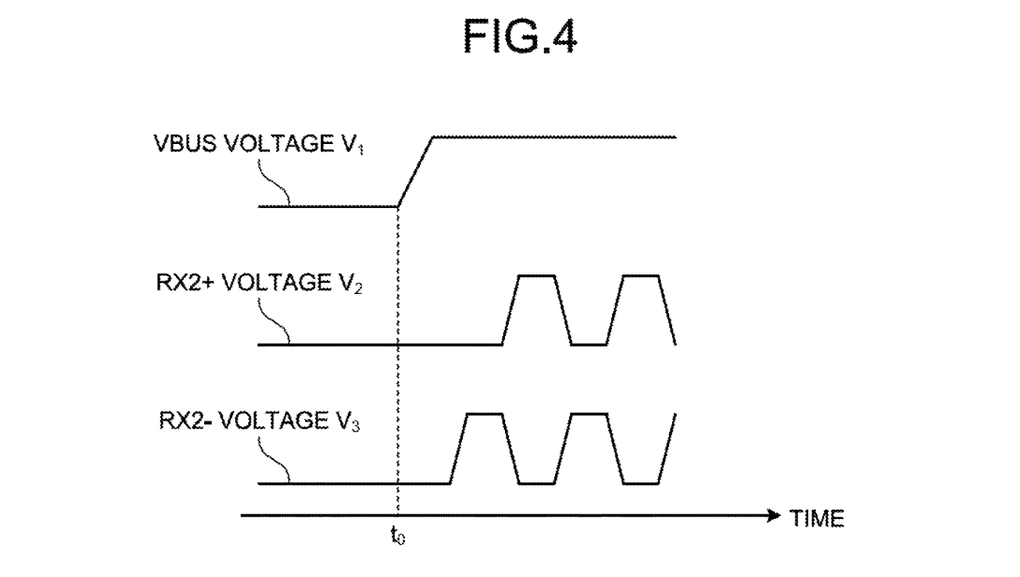
FIG. 4 is an explanatory diagram of processing performed by a determining circuit according to the first embodiment.
Figure 5:
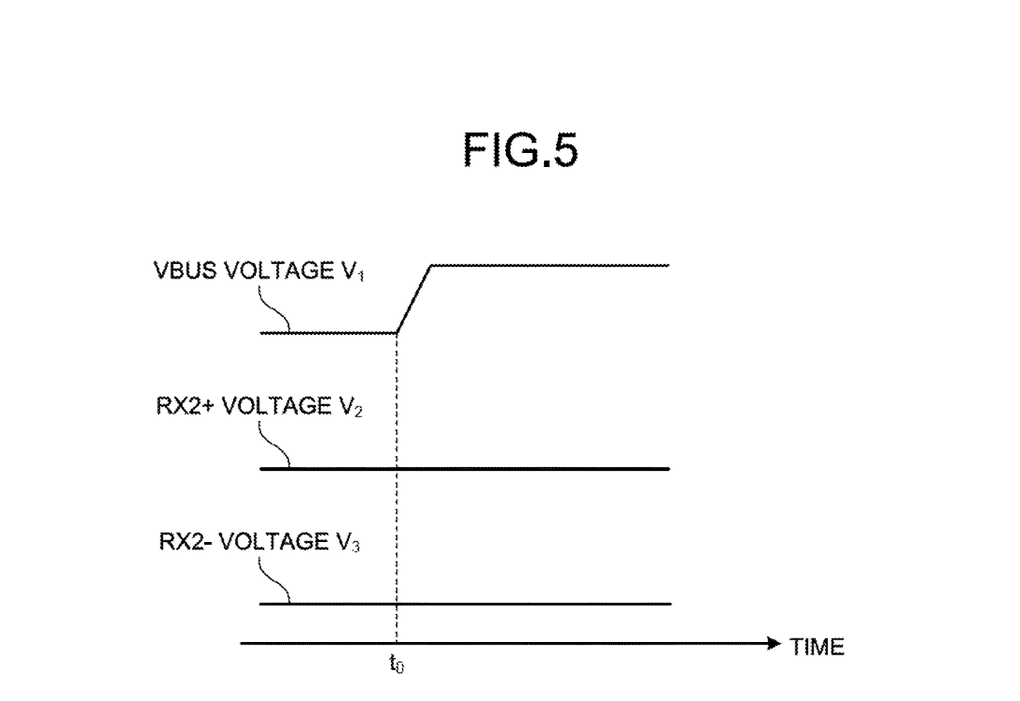
FIG. 5 is an explanatory diagram of processing performed by the determining circuit according to the first embodiment.
Figure 6:
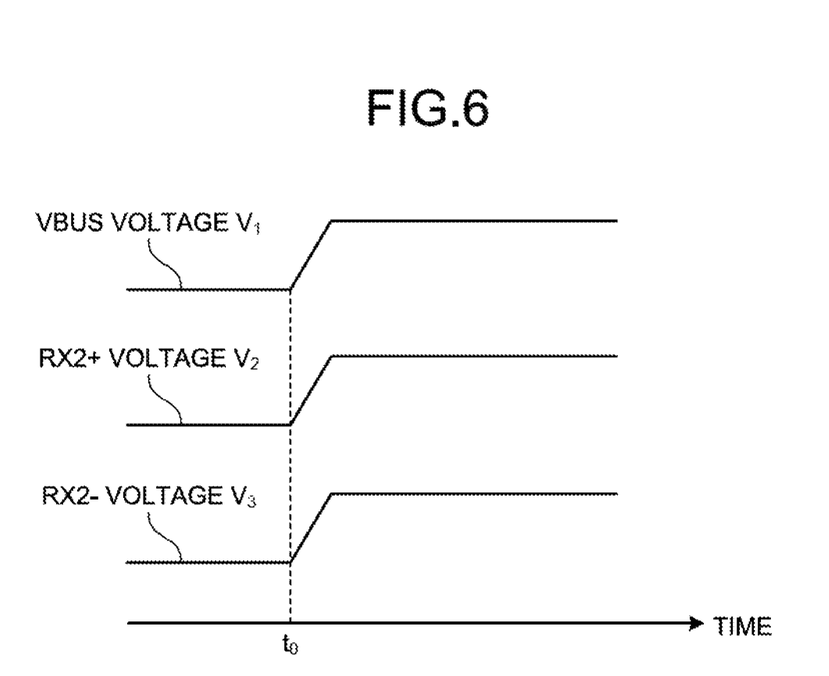
FIG. 6 is an explanatory diagram of processing performed by the determining circuit according to the first embodiment.

FIGS. 4 to 6 are explanatory diagrams of processing performed by the determining circuit 17 according to the first embodiment. FIG. 4 illustrates changes of the VBUS voltage $V_1$, the RX2+ voltage $V_2$, and the RX2− voltage $V_3$ when a communication device is connected as an external device to the Type-C connector 11 in a state where no foreign object is in the Type-C connector 11. In this example, the communication device is one that outputs a differential signal. FIG. 5 illustrates changes of the VBUS voltage $V_1$, the RX2+ voltage $V_2$, and the RX2− voltage $V_3$ when the charging device 30 is connected as the external device to the Type-C connector 11 in the state where no foreign object is in the Type-C connector 11. FIG. 6 illustrates changes of the VBUS voltage $V_1$, the RX2+ voltage $V_2$, and the RX2− voltage $V_3$ when the charging device 30 is connected as the external device to the Type-C connector 11 in a state where a foreign object is in the Type-C connector 11.

When the communication device is connected as the external device to the Type-C connector 11 in the state where no foreign object is in the Type-C connector 11, the VBUS voltage $V_1$ rises at a time $t_0$ as illustrated in FIG. 4. The RX2+ voltage $V_2$ and the RX2− voltage $V_3$ change according to a differential signal from the connected communication device after the time $t_0$ that is a rising timing of the VBUS voltage $V_1$ because the RX2+ terminal 114 and the RX2− terminal 115 receive the differential signal. That is, rising timings of the RX2+ voltage $V_2$ and the RX2-voltage $V_3$ are not consistent with the rising timing (the time $t_0$) of the VBUS voltage $V_1$, and a phase of the RX2+ voltage $V_2$ is inverted with respect to a phase of the RX2-voltage $V_3$.

When the charging device 30 is connected as the external device to the Type-C connector 11 in the state where no foreign object is in the Type-C connector 11, the VBUS voltage $V_1$ rises at the time $t_0$ as illustrated in FIG. 5. However, the RX2+ voltage $V_2$ and the RX2− voltage $V_3$ do not change irrespective of rising of the VBUS voltage $V_1$ because the RX2+ terminal 114 and the RX2− terminal 115 are not used in the state where the charging device 30 is connected to the Type-C connector 11.

In contrast thereto, when the charging device 30 is connected as the external device to the Type-C connector 11 in the state where a foreign object is in the Type-C connector 11, the VBUS voltage $V_1$ rises at the time $t_0$ as illustrated in FIG. 6. The RX2+ voltage $V_2$ and the RX2-voltage $V_3$ also rise associated with rising of the VBUS voltage $V_1$ because the VBUS terminal 111 is brought conduction to the RX2+ terminal 114 and the RX2− terminal 115 by the foreign object in the state where the foreign object is in the Type-C connector 11. That is, the rising timings of the RX2+ voltage $V_2$ and the RX2− voltage $V_3$ are consistent with the rising timing (the time $t_0$) of the VBUS voltage $V_1$, and the phase of the RX2+ voltage $V_2$ is consistent with the phase of the RX2− voltage $V_3$.

Therefore, the determining circuit 17 determines whether a short-circuit between the VBUS terminal 111 and the RX2+ and RX2− terminals 114 and 115 (hereinafter, "short-circuit") has occurred using a voltage change (that is, a change of the RX2+ voltage $V_2$ and a change of the RX2− voltage $V_3$) monitored by the monitoring circuit 16. The determining circuit 17 determines that a short-circuit has occurred due to entrance of a foreign object into the Type-C connector 11 when the rising timings of the RX2+ voltage $V_2$ and the RX2− voltage $V_3$ are consistent with the rising timing of the VBUS voltage $V_1$, as illustrated in FIG. 6.

Referring back to FIG. 3, the CC-terminal control circuit 18 controls the switch 13 according to a result of determination by the determining circuit 17. That is, the CC-terminal control circuit 18 sets the switch 13 on in an initial state. Accordingly, when the charging device 30 is connected to the Type-C connector 11, a path between the resistor 14 and the CC1 terminal 112 is connected, and therefore the resistance value of the resistor 14 can be provided to the charging device 30 via the CC1 terminal 112. With the use of the resistance value of the resistor 14, the charging device 30 can be caused to perform supply of power.

When it is determined by the determining circuit 17 that a short-circuit has occurred, the CC-terminal control circuit 18 turns off the switch 13 to electrically disconnect the CC1 terminal 112. When the CC-terminal control circuit 18 turns off the switch 13, the path between the resistor 14 and the CC1 terminal 112 is disconnected, and therefore the resistance value of the resistor 14 provided to the charging device 30 via the CC1 terminal 112 is blocked by the switch 13. Due to this, it is possible to cause the charging device 30 to stop supply of the power. Details of stopping supply of the power using the resistance value of the resistor 14 will be described later.

In FIG. 3, the charging device 30 includes the Type-C connector 31 and the AC adapter 32. The Type-C connector 31 includes a VBUS terminal 311, a CC1 terminal 312, a GND terminal 313, an RX2+ terminal 314, and an RX2− terminal 315. The VBUS terminal 311 is a charging terminal that outputs charging power supplied from the AC adapter 32 to the electronic device 10. The CC1 terminal 312 is a terminal for receiving the resistance value of the resistor 14 provided from the electronic device 10 when the charging device 30 is connected to the Type-C connector 11. The GND terminal 313 is a ground terminal set at a ground potential, and causes the ground potential to be common to the charging device 30 and the electronic device 10. The RX2+ terminal 314 and the RX2− terminal 315 are a pair of signal terminals for receiving a differential signal. The RX2+ terminal 314 and the RX2− terminal 315 are not used in a state where the charging device 30 is connected to the Type-C connector 11, as illustrated in FIG. 3.

The AC adapter 32 includes a power-supply circuit 321, a switch 322, a resistor 323, and a voltage comparator 324.

The power-supply circuit 321 is connected to the VBUS terminal 311 via the switch 322, and is connected to the CC1 terminal 312 via the resistor 323. The power-supply circuit 321 outputs power supplied from a commercial power supply that is an external power supply, as the charging power. The charging power output from the power-supply circuit 321 is supplied to the VBUS terminal 311 via the switch 322. A voltage (hereinafter, "output voltage") corresponding to the charging power output from the power-supply circuit 321 is supplied to the CC1 terminal 312 via the resistor 323.

The voltage comparator 324 compares a voltage generated at the resistor 323, that is, a voltage at the CC1 terminal 312 with a reference voltage that is lower than the output voltage of the power-supply circuit 321, and controls the switch 322 according to a result of the comparison. That is, because the output voltage of the power-supply circuit 321 is generated at the resistor 323 without being changed before the charging device 30 is connected to the Type-C connector 11, the output voltage of the power-supply circuit 321 is detected as the voltage at the CC1 terminal 312 by the voltage comparator 324. Therefore, the voltage comparator 324 keeps the switch 322 off because the voltage at the CC1 terminal 312 is not consistent with the reference voltage in the state where the charging device 30 is not connected to the Type-C connector 11.

When the charging device 30 is connected to the Type-C connector 11, the CC1 terminal 312 receives the resistance value of the resistor 14 provided from the electronic device 10, and therefore the output voltage of the power-supply circuit 321 is divided according to a ratio between the resistance value of the resistor 14 and a resistance value of the resistor 323. Because of this division of the output voltage of the power-supply circuit 321, a voltage lower than the output voltage of the power-supply circuit 321 is generated at the resistor 323. The voltage generated at the resistor 323 is detected as the voltage at the CC1 terminal 312 by the voltage comparator 324. Therefore, the voltage comparator 324 turns on the switch 322 when the voltage at the CC1 terminal 312 drops to the reference voltage in the state where the charging device 30 is connected to the Type-C connector 11. When the voltage comparator 324 turns on the switch 322, a path between the VBUS terminal 311 and the power-supply circuit 321 is opened, so that supply of the power from the power-supply circuit 321 (that is, the charging device 30) to the electronic device 10 is performed.

When the CC1 terminal 112 is electrically disconnected by the CC-terminal control circuit 18 in the state where the charging device 30 is connected to the Type-C connector 11, the resistance value of the resistor 14 is not received by the CC1 terminal 312. In this case, the output voltage of the power-supply circuit 321 is not divided according to the ratio between the resistance value of the resistor 14 and the resistance value of the resistor 323. Therefore, the output voltage of the power-supply circuit 321 is generated at the resistor 323 without being changed, so that the output voltage of the power-supply circuit 321 is detected as the voltage at the CC1 terminal 312 by the voltage comparator 324. At this time, because the voltage at the CC1 terminal 312 is no longer consistent with the reference voltage, the voltage comparator 324 turns off the switch 322. Because of turning-off the switch 322 by the voltage comparator 324, the path between the VBUS terminal 311 and the power-supply circuit 321 is disconnected, so that supply of the power from the power-supply circuit 321 (that is, the charging device 30) to the electronic device 10 is stopped.

Processing by Electronic Device

Figure 7:
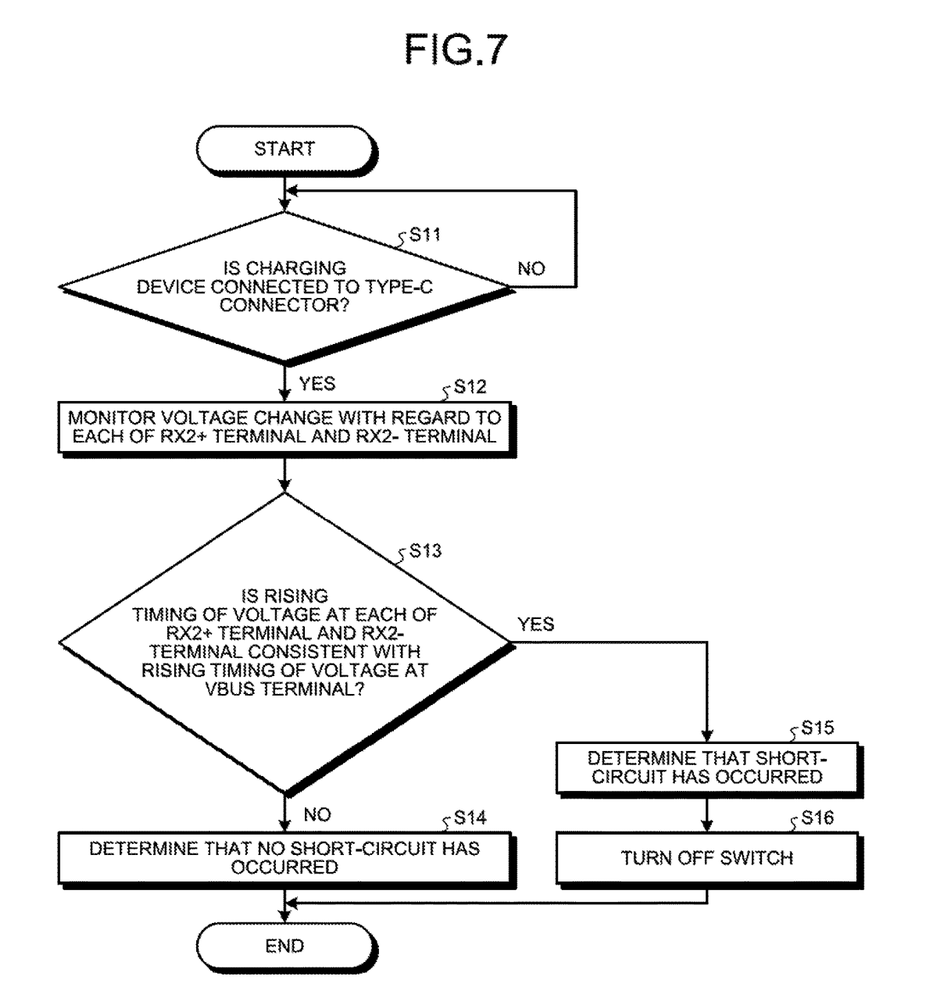
FIG. 7 is a flowchart for explaining processing performed by the electronic device according to the first embodiment.

FIG. 7 is a flowchart for explaining processing performed by the electronic device 10 according to the first embodiment. The flowchart illustrated in FIG. 7 is started with connection of the charging device 30 to the Type-C connector 11 used as a trigger. That is, the flowchart illustrated in FIG. 7 is started with input of a charging-device connection detecting notification to the monitoring circuit 16 and the determining circuit 17 used as a trigger.

When the charging device 30 is not connected to the Type-C connector 11 (NO at Step S11), the electronic device 10 stands by. When the charging device 30 is connected to the Type-C connector 11 (YES at Step S11), the monitoring circuit 16 monitors a voltage change with regard to each of the RX2+ terminal 114 and the RX2− terminal 115 (Step S12).

The determining circuit 17 determines whether rising timings of the RX2+ voltage $V_2$ and the RX2− voltage $V_3$ are consistent with a rising timing of the VBUS voltage $V_1$ (Step S13).

When the rising timings of the RX2+ voltage $V_2$ and the RX2− voltage $V_3$ are not consistent with the rising timing of the VBUS voltage $V_1$ (NO at Step S13), the determining circuit 17 determines that no short-circuit has occurred (Step S14).

When the rising timings of the RX2+ voltage $V_2$ and the RX2− voltage $V_3$ are consistent with the rising timing of the VBUS voltage $V_1$ (YES at Step S13), the determining circuit 17 determines that a short-circuit has occurred (Step S15).

When it is determined by the determining circuit 17 that a short-circuit has occurred, the CC-terminal control circuit 18 turns off the switch 13 to electrically disconnect the CC1 terminal 112 (Step S16).

As described above, according to the present embodiment, the monitoring circuit 16 monitors a voltage change with regard to each of the RX2+ terminal 114 and the RX2− terminal 115 in a state where the charging device 30 is connected to the Type-C connector 11 in the electronic device 10. The determining circuit 17 then determines whether a short-circuit between the VBUS terminal 111 and the RX2+ and RX2− terminals 114 and 115 has occurred using the voltage change at each of the RX2+ terminal 114 and the RX2− terminal 115. Specifically, the determining circuit 17 determines that a short-circuit has occurred when the rising timing of a voltage at each of the RX2+ terminal 114 and the RX2− terminal 115 is consistent with a rising timing of a voltage at the VBUS terminal 111.

With this configuration of the electronic device 10, it is possible to determine a state where the VBUS terminal 111 is brought conduction to the RX2+ terminal 114 and the RX2− terminal 115 by a foreign object bridging the VBUS terminal 111 and the GND terminal 113. Consequently, a short-circuit between terminals caused by entrance of a foreign object into the Type-C connector 11 can be determined with high accuracy in the electronic device 10 including the Type-C connector 11 according to the present embodiment.

In the electronic device 10, when it is determined that a short-circuit has occurred, the CC-terminal control circuit 18 electrically disconnects the CC1 terminal 112 that provides the charging device 30 with the resistance value of the resistor 14 for causing the charging device 30 to perform supply of power.

With this configuration of the electronic device 10, it is possible to cause the charging device 30 to stop supply of the power when it is determined that a short-circuit between the terminals caused by entrance of a foreign object into the Type-C connector 11 has occurred. Therefore, it is possible to prevent heat generation of the foreign object caused by a flow of the power supplied from the charging device 30 into the foreign object.

Consequently, a malfunction of the electronic device 10 caused by heat generation of the foreign object can be avoided.

[b] Other Embodiments

In the embodiment described above, the determining circuit 17 is described as determining that a short-circuit has occurred when a rising timing of a voltage at each of the RX2+ terminal 114 and the RX2− terminal 115 is consistent with a rising timing of a voltage at the VBUS terminal 111. However, the determining circuit 17 may determine that a short-circuit has occurred when a phase of a voltage at one signal terminal out of the RX2+ terminal 114 and the RX2− terminal 115 is consistent with a phase of a voltage at the other signal terminal.

Further, in the above embodiment, a case is described as an example, in which the electronic device 10 includes the Type-C connector 11 as a connector for connection to an external device. However, even in a case where the electronic device 10 includes a connector other than the Type-C connector 11 as the connector for connection to an external device, the disclosed technique can be carried out as long as a pair of signal terminals for receiving a differential signal is arranged between a VBUS terminal and a ground terminal.

In the embodiment described above, the connection detecting circuit 15, the monitoring circuit 16, the determining circuit 17, and the CC-terminal control circuit 18 can be realized by a processor. Examples of the processor are a CPU (Central Processing Unit), a DSP (Digital Signal Processor), and an FPGA (Field Programmable Gate Array).

According to an aspect of the short-circuit determination method disclosed in the present application, a short-circuit between terminals caused by entrance of a foreign object into a connector can be determined with high accuracy.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A short-circuit determination method in an electronic device including a connector for connection to an external device, comprising:

in a state where a charging device is connected to the connector, monitoring a voltage change with regard to each of a pair of signal terminals that receives a differential signal among a plurality of terminals included in the connector, the pair of signal terminals being arranged between a charging terminal that receives power supplied from the charging device and a ground terminal; and determining whether a short-circuit between the charging terminal and the pair of signal terminals has occurred using a change of a rising timing of a voltage at each of the pair of signal terminals.

2. The short-circuit determination method according to claim 1, wherein at the determining, it is determined that the short-circuit has occurred when a rising timing of a voltage at each of the pair of signal terminals is consistent with a rising timing of a voltage at the charging device.

3. The short-circuit determination method according to claim 1, wherein at the determining, it is determined that the short-circuit has occurred when a phase of a voltage at one signal terminal out of the pair of signal terminals is consistent with a phase of a voltage at the other signal terminal.

4. The short-circuit determination method according to claim 1, further comprising electrically disconnecting one of the terminals included in the connector, which provides the charging device with a resistance value for causing the charging device to perform supply of the power when it is determined that the short-circuit has occurred.

5. An electronic device including a connector for connection to an external device, comprising:

a monitoring unit that monitors, in a state where a charging device is connected to the connector, a voltage change with regard to each of a pair of signal terminals that receives a differential signal among a plurality of terminals included in the connector, the pair of signal terminals being arranged between a charging terminal that receives power supplied from the charging device and a ground terminal; and a determining unit that determines whether a short-circuit between the charging terminal and the pair of signal terminals has occurred using a change of a rising timing of a voltage at each of the pair of signal terminals.

* * * * *